US009449890B1

(12) United States Patent
Quan et al.

(10) Patent No.: US 9,449,890 B1
(45) Date of Patent: Sep. 20, 2016

(54) METHODS FOR TEMPORARY BUSSING OF SEMICONDUCTOR PACKAGE SUBSTRATES

(71) Applicant: Amkor Technology, Inc., Tempe, AZ (US)

(72) Inventors: Johnnie Quan, Chandler, AZ (US); August Joseph Miller, Jr., Chandler, AZ (US); Kurt Raymond Raab, Phoenix, AZ (US); Jeffery Alan Miks, Chandler, AZ (US)

(73) Assignee: AMKOR TECHNOLOGY, INC., Tempe, AZ (US)

( * ) Notice: Subject to any disclaimer, the term of this patent is extended or adjusted under 35 U.S.C. 154(b) by 0 days.

(21) Appl. No.: 13/892,118

(22) Filed: May 10, 2013

(51) Int. Cl.
  H01L 21/66 (2006.01)
  H01L 21/479 (2006.01)

(52) U.S. Cl.
  CPC ............ *H01L 22/14* (2013.01); *H01L 21/479* (2013.01)

(58) Field of Classification Search
  None
  See application file for complete search history.

(56) References Cited

U.S. PATENT DOCUMENTS

| 5,593,606 | A * | 1/1997 | Owen et al. | 219/121.71 |
| 6,319,418 | B1 * | 11/2001 | Verdeflor | H05K 3/242 |
| | | | | 216/13 |
| 2005/0051881 | A1 * | 3/2005 | Chen | H01L 23/544 |
| | | | | 257/678 |
| 2005/0246892 | A1 * | 11/2005 | Chen | H05K 3/242 |
| | | | | 29/846 |
| 2005/0269130 | A1 * | 12/2005 | Johnson | 174/261 |
| 2007/0243666 | A1 * | 10/2007 | Huang | H01L 21/561 |
| | | | | 438/127 |
| 2008/0171402 | A1 * | 7/2008 | Karnezos | 438/15 |
| 2009/0317948 | A1 * | 12/2009 | Nakamura et al. | 438/123 |
| 2010/0003788 | A1 * | 1/2010 | Wang | H01L 23/3677 |
| | | | | 438/118 |
| 2012/0032352 | A1 * | 2/2012 | Huening | 257/782 |
| 2012/0153443 | A1 * | 6/2012 | Grinman et al. | 257/660 |
| 2012/0235309 | A1 * | 9/2012 | Essig et al. | 257/782 |

\* cited by examiner

*Primary Examiner* — Benjamin Sandvik
*Assistant Examiner* — Herve Assouman
(74) *Attorney, Agent, or Firm* — McAndrews, Held & Malloy, Ltd.

(57) ABSTRACT

Methods for temporary bussing of semiconductor package substrates are disclosed and may include metal plating regions of a packaging substrate utilizing a plurality of bussed traces, which may be decoupled by forming debuss holes at intersections of the bussed traces. The decoupled traces may then be electrically tested, and the packaging substrate may be singulated into a plurality of substrates utilizing a sawing process through singulation areas in the packaging substrate. The traces may be electrically coupled via plating bars in the substrate. The plating bars may be located in the singulation areas. The intersections of the bussed traces may be in a Y pattern, which may be repeated along the singulation areas. The debuss holes may be formed utilizing mechanical drilling or lasing. The regions of the packaging substrate may be metal plated utilizing an electroplating process. The plurality of bussed traces may be biased for the electroplating process.

22 Claims, 8 Drawing Sheets

METHODS FOR TEMPORARY BUSSING OF SEMICONDUCTOR PACKAGE SUBSTRATES

FIELD OF THE INVENTION

Certain embodiments of the invention relate to semiconductor chip packaging. More specifically, certain embodiments of the invention relate to methods for temporary bussing of semiconductor package substrates.

BACKGROUND OF THE INVENTION

Semiconductor packaging protects integrated circuits, or chips, from physical damage and external stresses. In addition, it can provide a thermal conductance path to efficiently remove heat generated in a chip, and also provide electrical connections to other components such as printed circuit boards, for example. Materials used for semiconductor packaging typically comprise ceramic or plastic, and form-factors have progressed from ceramic flat packs and dual in-line packages to pin grid arrays and leadless chip carrier packages, among others.

Further limitations and disadvantages of conventional and traditional approaches will become apparent to one of skill in the art, through comparison of such systems with the present invention as set forth in the remainder of the present application with reference to the drawings.

DETAILED DESCRIPTION OF THE INVENTION

Certain aspects of the invention may be found in methods for temporary bussing of semiconductor package substrates. Example aspects of the invention may comprise metal plating regions of a packaging substrate utilizing bussed traces of the packaging substrate. The bussed traces may be decoupled by forming debuss holes at one or more intersections of the bussed traces. The decoupled traces may then be electrically tested, and the packaging substrate may be singulated into a plurality of substrates utilizing sawing, punching, or other singulation process through singulation areas in the packaging substrate. The bussed traces may be electrically coupled via one or more plating bars in the packaging substrate. The plating bars may be located in the singulation areas. The intersections of the bussed traces may be in a Y pattern, which may be repeated along the singulation areas. The holes may be formed utilizing mechanical drilling. The holes may be formed utilizing lasing. The regions of the packaging substrate may be metal plated utilizing an electroplating process. The plurality of bussed traces may be biased for the electroplating process. The debuss holes may be located in the singulation areas.

Figure 1A:
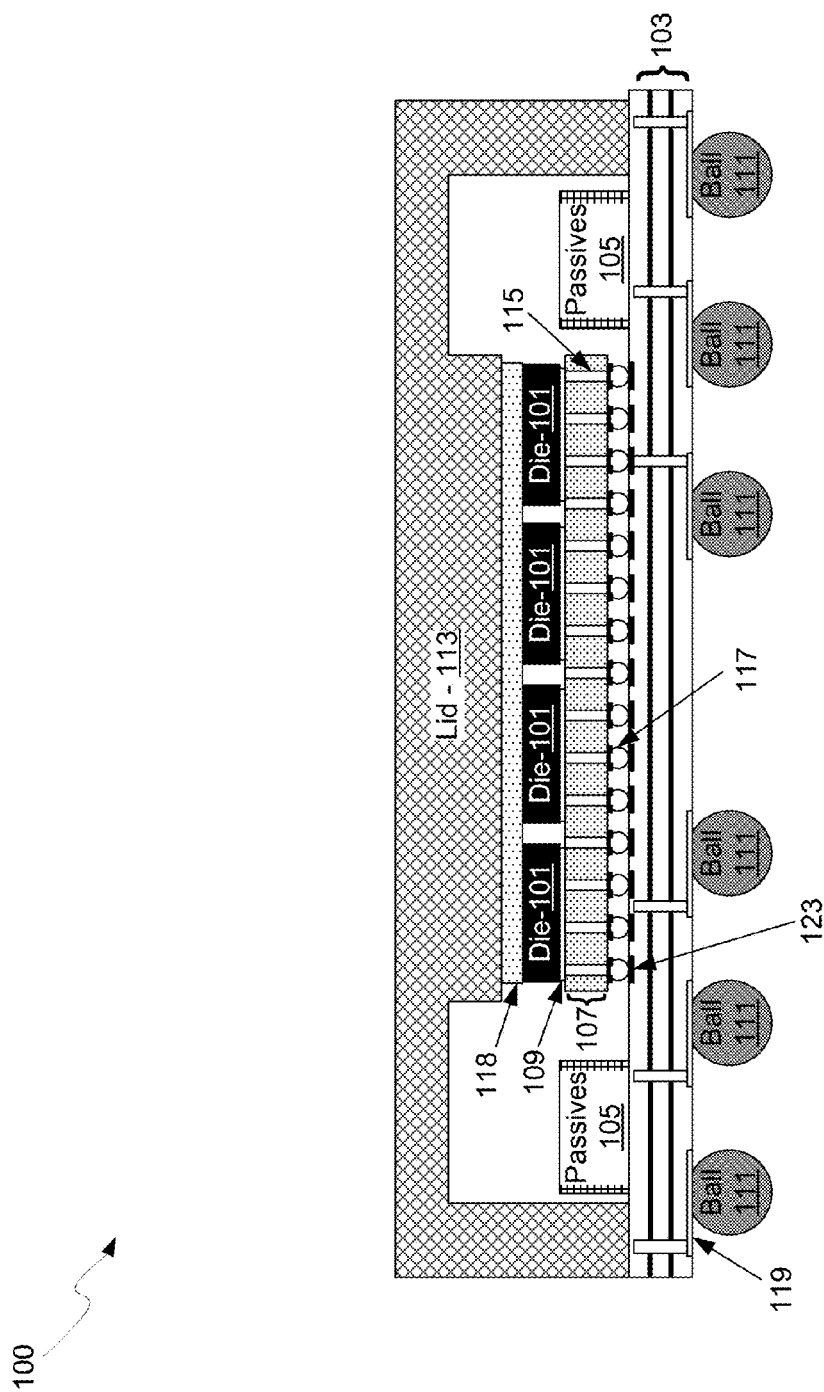
FIG. 1A is a drawing illustrating an integrated circuit package configured utilizing plating of the packaging substrate, in accordance with an example embodiment of the invention.

FIG. 1A is a drawing illustrating an integrated circuit package configured utilizing plating of the packaging substrate, in accordance with an example embodiment of the invention. Referring to FIG. 1A, there is shown a package 100 comprising a plurality of die 101, a packaging substrate 103, passive devices 105, an interposer 107, solder balls 111, a lid 113, and thermal interface material 118.

The die 101 may comprise integrated circuit die that have been separated from one or more semiconductor wafers. The die 101 may comprise electrical circuitry such as digital signal processors (DSPs), network processors, power management units, audio processors, RF circuitry, wireless baseband system-on-chip (SoC) processors, sensors, and application specific integrated circuits, for example. In addition, the die 101 may comprise micro-bumps 109 for providing electrical contact between the circuitry in the die 101 and contact pads on the surface of the interposer 107.

The interposer 107 may comprise a semiconductor wafer, such as a silicon wafer, with through-silicon-vias (TSVs) 115 that provide electrically conductive paths from one surface of the interposer 107 to the opposite surface. The interposer 107 may also comprise bumps 117 for making electrical and mechanical contact to the packaging substrate 103. In another example scenario, the interposer 107 may comprise glass or an organic laminate material The packaging substrate 103 may comprise a mechanical support structure for the interposer 107, the die 101, the passive devices 105, and the lid 113. The packaging substrate is typically manufactured in large panel formats on the order of 500×500 mm, comprising a multiplicity/plurality of individual substrates. The packaging substrate 103 may be coupled to an external structure such as a printed circuit board, for example, using the solder balls 111 on the bottom surface. The packaging substrate 103 may also comprise conductive traces in a non-conductive material for providing conductive paths from the solder balls to the die 101 via pads that are configured to receive the bumps 117. Additionally, the packaging substrate 103 may comprise pads 119 for receiving the solder balls 111, and flip-chip bump pads 123 for receiving the bumps 117. The pads 119 and the flip-chip bump pads 123 may comprise one or more under-bump metals, for example, for providing a proper electrical and mechanical contact between the packaging substrate 103 and the solder balls 111.

In an example scenario, the packaging substrate 103 may be plated utilizing plating buss traces that are internal and/or external to the substrate. Areas that may be plated comprise outer surfaces of the packaging substrate 103, exposed metals, the flip-chip bump pads 123, ball-grid array pads 119, and die pads, for example. Accordingly, the coupling and decoupling of the plating buss traces is enabled on bussed multilayer or single layer substrate designs. By placing target points outside of the substrate outline in the saw street, this enables a location for a plating trace to connect to the buss bar. By shorting all the nets in the design, an electroplating process may proceed with the interconnected traces biased at an appropriate potential for plating to take place. Where the plating traces and the buss bar connects, an x,y location may be defined, which may be where a hole may be placed after all plating processes of the packaging substrate 103 have been completed. Once the holes have been formed, the individual nets may be preserved to allow open/short testing.

The passive devices 105 may comprise electrical devices such as resistors, capacitors, and inductors, for example, which may provide functionality to devices and circuits in the die 101. The passive devices 105 may comprise devices that may be difficult to integrate in the integrated circuits in the die 101, such as high value capacitors or inductors. In another example scenario, the passive devices 105 may comprise one or more crystal oscillators for providing one or more clock signals to the die 101.

The lid 113 may provide a hermetic seal, if desired, for the devices within the cavity defined by the lid 113 and the packaging substrate 103. A thermal interface may be created for heat transfer out of the die 101 to the lid 113 via the thermal interface material 118, which may also act as an adhesive.

Figure 1B:
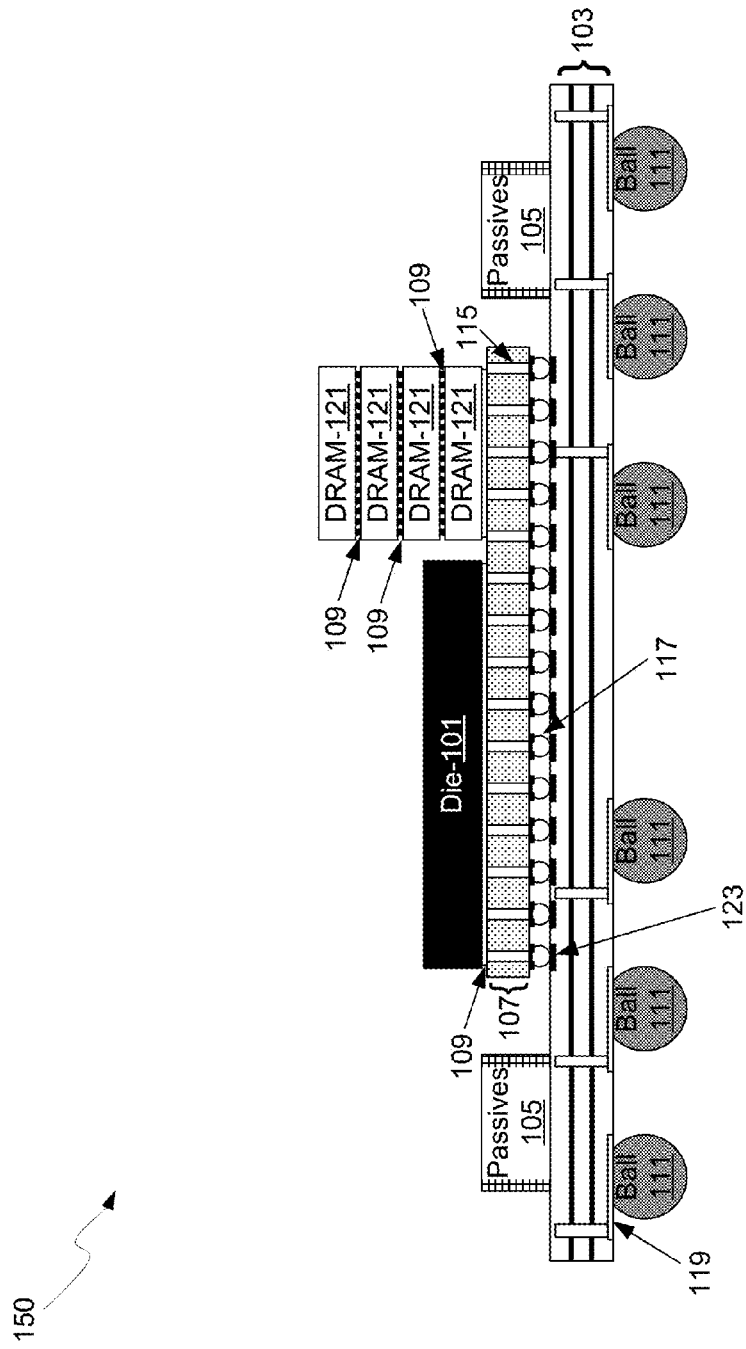
FIG. 1B is a drawing illustrating an integrated circuit package configured with plating of the packaging substrate, in accordance with an example embodiment of the invention.

FIG. 1B is a drawing illustrating an integrated circuit package configured with plating of the packaging substrate, in accordance with an example embodiment of the invention. Referring to FIG. 1B, there is shown a package 150 comprising the die 101, the packaging substrate 103, the passive devices 105, the interposer 107, and a stack of dynamic random access memory (DRAM) 121. The die 101, the packaging substrate 103, the passive devices 105, and the interposer 107 may be substantially as described with respect to FIG. 1A, for example, but with different electrical connectivity for the different die 101 and the stack of DRAM 121.

The DRAM 121 may comprise a stack of die for providing a high density memory for circuitry in the die 101 or external to the package 150. The stack of DRAM 121 may be stacked front-to-back and therefore comprise TSV's for providing electrical connectivity between the individual die.

In an example scenario, the package 150 may be fabricated by first bonding the die 101 and the DRAM 121 to the interposer 107 when still in wafer form, i.e., before singulation into individual interposer die.

Once singulated, the assembly may then be bonded to the packaging substrate 103 utilizing either a mass reflow or thermal compression process. In an example scenario, the packaging substrate 103 may comprise a single layer or multi-layer packaging substrate fabricated utilizing plating buss traces that may be internal to or on the surface of the package The plating buss traces may be connected to one or more plating bars in the saw street at the outer edges of the substrate. After the plating processes are completed, holes may be formed at the intersections of the plating buss traces and the plating bar or bars, thereby separating the circuits as desired for normal operation. The forming of the holes may comprise mechanical drilling or lasing, for example.

In instances where only the die 101 is placed on the interposer 107 in the first bond process described above, the die 101 may be subjected to electrical testing before bonding the remaining die, namely the stack of DRAM 121. This may be advantageous in instances where significant cost differences between die make it desirable to bond and test the lower cost die before bonding the more costly die, such as when the stack of DRAM 121 is much more costly than the die 101. After the die 101 have been tested, the stack of DRAM 121 may be bonded to the interposer 107 utilizing a mass reflow or thermal compression process, for example, and a capillary underfill may be applied to fill the volume between the stack of DRAM 121 and the interposer 107.

Once the stack of DRAM 121 is bonded to the interposer 107, a lid may be placed on the bonded assembly to provide a hermetic seal, if desired, and to protect the circuitry from the external environment. Finally, electrical tests may be performed on the remaining die following the bonding processes to verify that proper electrical connections were made and no shorts or open circuits exist.

Figure 2:
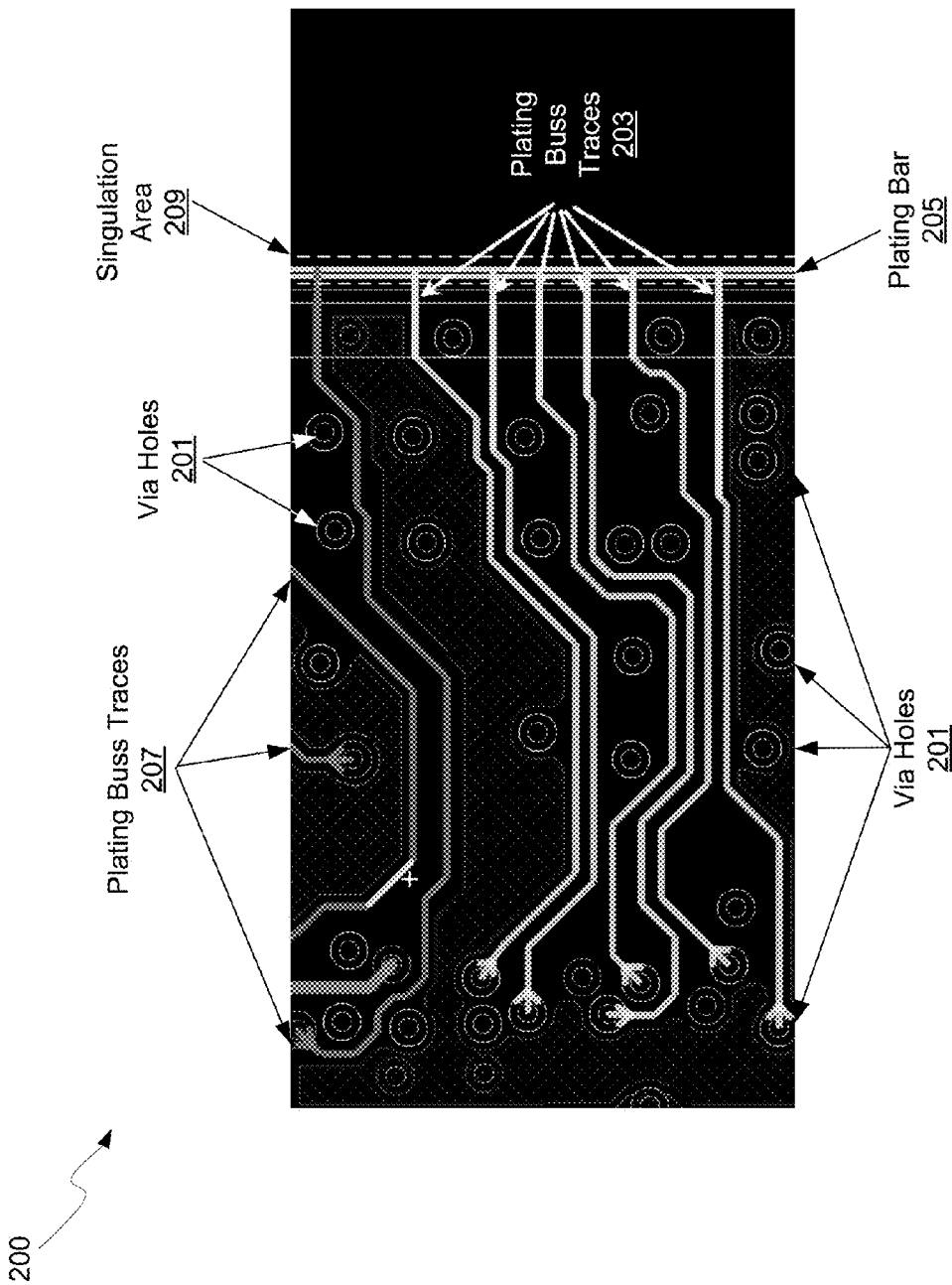
FIG. 2 is a drawing illustrating plating buss traces, in accordance with an example embodiment of the invention.

FIG. 2 is a drawing illustrating plating buss traces, in accordance with an example embodiment of the invention. Referring to FIG. 2, there is shown a packaging substrate 200 comprising via holes 201, plating buss traces 203, a plating bar 205, plating buss traces 207, and a singulation area 209.

The packaging substrate 200 may be substantially similar to the packaging substrate 103 and may comprise a mechanical support structure for a plurality of structures, such as an interposer and other semiconductor die, and passive devices, for example. The packaging substrate 200 may comprise a single or multi-layer structure and may comprise conductive pads on the bottom surface for providing electrical contact to external devices and circuits, for example.

The via holes 201 may comprise connected openings through the packaging substrate 200 for enabling electrical continuity between points in the various layers of the packaging substrate 200. Accordingly, some or all of the via holes 201 may be plated with metal to provide electrically conductive paths between layers. Similarly, some or all of the circular patterns shown in FIG. 2 may comprise via holes. The holes may be completely through or partially through the substrate.

The plating buss traces 203 may comprise metal lines placed in an inner conductive plane of the packaging substrate 200. In this manner, a higher density of interconnections may be made since connections are not limited to points on the top surface of the packaging substrate 200. Plating buss traces may be utilized to connect all metal surfaces in the packaging substrate 200 that are to be covered with metal in a subsequent plating process. Similarly, the plating buss traces 207 may comprise traces on the outer surface of the packaging substrate 200. In another example scenario, the plating buss traces 203 and the plating buss traces 207 may be coplanar in the packaging substrate 200. The plating buss traces 203 and the plating buss traces 207 may be coupled together and biased at a potential suitable for plating during an electroplating process, for example. However, once the plating has been completed, the various traces may generally need to be separated to facilitate electrical testing of distinct circuits.

The plating bar 205 may comprise a metal bar, buss, or trace, for applying a voltage to the plating buss traces 207 and the plating buss traces 203 to enable an electroplating process, for example. The plating bar 205 may be substantially similar to the plating buss traces 207 but collinear with the singulation area 209. In addition, the plating bar 205 may be in any metal layer of the packaging substrate 200.

The singulation area 209 may comprise a zone or region to assist in singulating the packaging substrate 200 from adjacent substrates within a panel. In this example, the singulation zone is waste material outside the substrate outline disposed of during singulation. The singulation step may occur before any components are bonded to the substrate, or may occur once one or more semiconductor and interposer die have been bonded to the packaging substrate. In other example scenarios, singulation may be executed by punching, sawing, lasing, or by other methods known to those skilled in the art.

In an example scenario, the internal plating buss traces 203 and the plating buss traces 207 may be coupled and biased at an appropriate potential for a plating process. At minimum, one end of each trace may intersect at plating bar 205, as illustrated in FIG. 2, which may be utilized to apply the bias voltage. Plating buss traces may also be connected to other buss traces connected to the plating bar 205. Once the plating is completed, the coupled buss traces may be severed from the plating bar 205, and at connections between plating traces, isolating the circuits for subsequent electrical testing prior to singulation of the packaging substrate 200.

Figure 3:
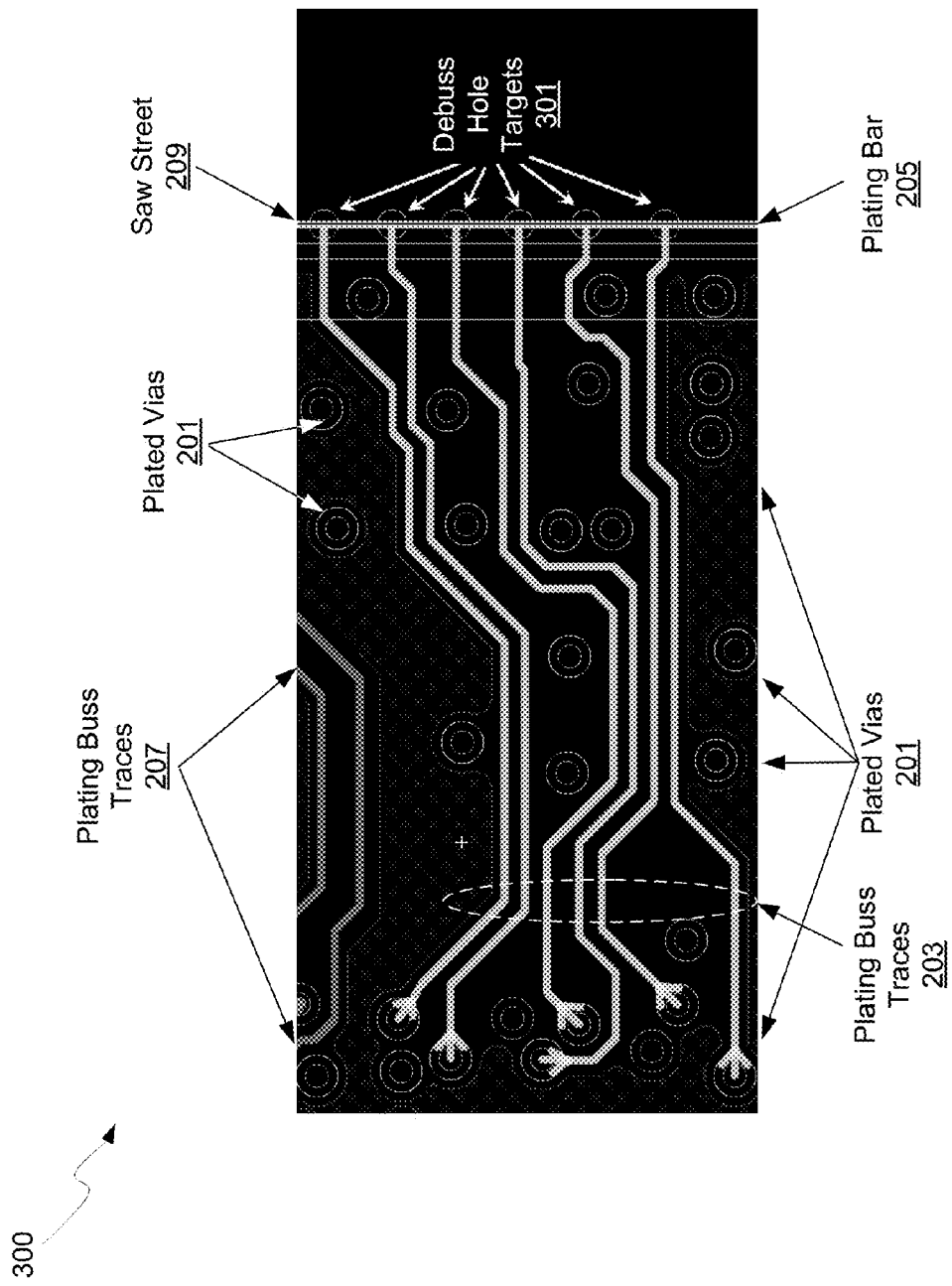
FIG. 3 is a drawing illustrating plating traces coupled to a plating bar, in accordance with an example embodiment of the invention.

FIG. 3 is a drawing illustrating plating traces coupled to a plating bar, in accordance with an example embodiment of the invention. Referring to FIG. 3, there is shown a packaging substrate 300 with coupled plating traces comprising the internal plating traces 203 and the plating traces 207. The traces may be coupled to the plating bar 205, at locations indicated by the debuss hole targets 301 in the singulation area 209. While the hole targets 301 are shown in the singulation area 209, their location is not so limited. Accordingly, the debuss hole targets 301 may be placed anywhere in the packaging substrate 300 with a plating bar on an internal, or external, layer of the substrate, and where debuss holes may be formed. In another example scenario, the debuss hole targets 301 may be located interior to the substrate outline.

The plating buss traces 203 and 207 may be utilized to plate regions of the packaging substrate 300 where metal plating is desired, such as solder ball pads, wirebond pads, or flip-chip bump pads, for example.

In an example scenario, the plating buss traces 203 and the plating buss traces 207 may be biased at an appropriate potential for plating purposes utilizing the plating bar 205. In the plating process, the packaging substrate 300 may be exposed to a solution where metal may precipitate on exposed circuit areas biased at the appropriate voltage. In this manner, exposed circuit areas or regions such as the pads 119 and the flip-chip bump pads 123 may be plated with metal.

Following the plating process, the hole targets may be formed utilizing a mechanical drill or a laser, for example. By drilling through the intersections of the plating buss traces 203 and the plating buss traces 207 with the plating bar 205, the respective circuitry and/or devices coupled to these traces may be isolated from each other, thereby enabling electrical testing of the devices prior to the singulation of the packaging substrate 300. After electrical testing, substrates may be physically marked, individually identified or otherwise logged and tracked as known-electrically-good and or known-electrical-reject substrates within any panel or subdivided panel thus marked or tracked. The selective decoupling of circuitry coupled to plating buss traces, electrical testing and identification of electrically-good and electrical-reject substrates before singulating may allow cost reduction by enabling further processing and assembly in a large non-singulated panelized format in which the assembly and or application of all or some high-value components, materials or processing may be omitted for known electrical-reject substrates. The resulting structure is illustrated in FIG. 4.

Figure 4:
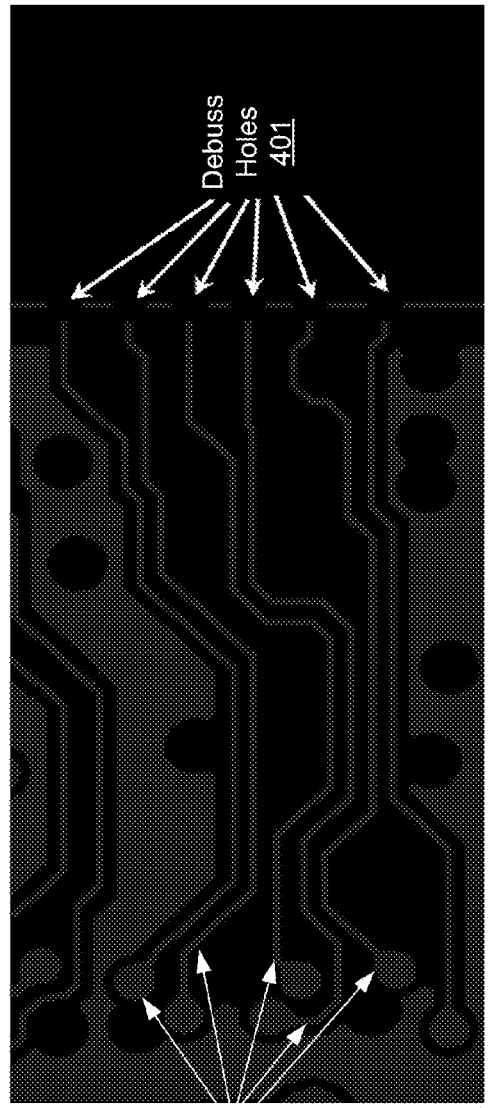
FIG. 4 is a drawing illustrating traces after electrolytic plating and debussing, in accordance with an example embodiment of the invention.

FIG. 4 is a drawing illustrating traces after electrolytic plating and debussing, in accordance with an example embodiment of the invention. Referring to FIG. 4, there is shown a packaging substrate 400 comprising debuss holes 401 and decoupled traces 403.

The debuss holes 401 comprise holes formed in the packaging substrate 400 to separate circuitry coupled to the plating buss traces 203 and the plating buss traces 207 resulting in the decoupled traces 403. The debuss holes may be drilled, lased, punched, or formed by any other technique known to those skilled in the art. In another example scenario, the holes may not be formed all the way through the packaging substrate 400, but only through the traces to be decoupled. This selective decoupling of circuitry coupled to plated traces prior to singulation may improve yields and reduce costs as the circuitry and connecting traces may be tested before expending significant time and expense in processing defective packaging substrates 400.

Figure 5:
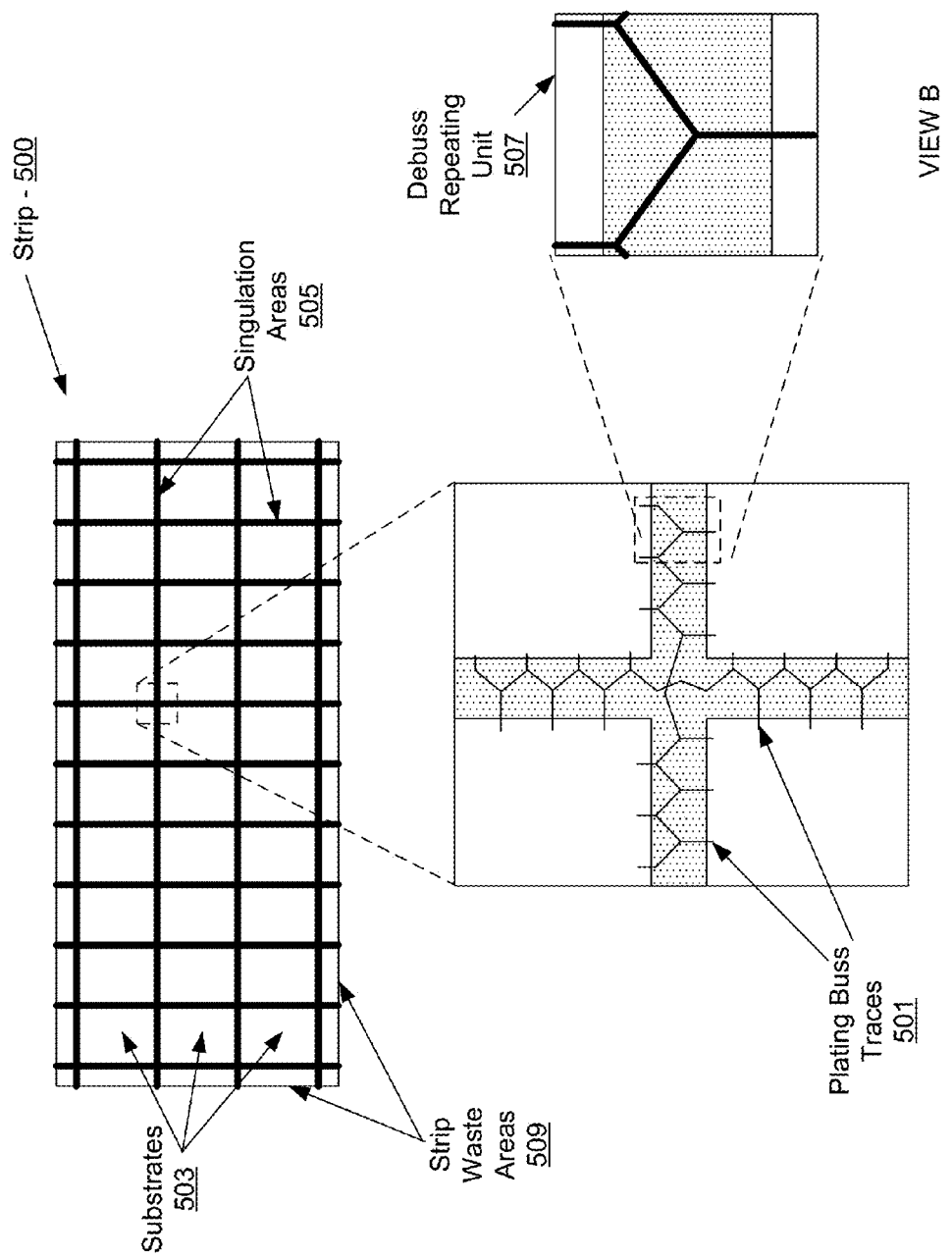
FIG. 5 is a drawing illustrating a substrate debuss design, in accordance with an example embodiment of the invention.

FIG. 5 is a drawing illustrating a substrate debuss design, in accordance with an example embodiment of the invention. Referring to FIG. 5, there is shown a strip 500, comprising a strip of individual substrates 503 prior to singulation, singulation areas 505, and strip waste areas 509. FIG. 5 shows insets with further detail on the outlined structures. For example, view "A" shows greater detail of the intersection of two singulation axes, illustrating plating buss traces 501 and the debuss repeating units 507, which are shown in further detail in view "B".

Substrates for IC packaging assembly are often arrayed within a larger "strip," as shown by the strip 500, which may be input to the assembly process. The larger strip facilitates handling within the assembly process as opposed to processing multiple individual substrates, and individual packaged units may subsequently be "singulated" from the strip at or near the end of the assembly process. In addition, substrate strips may be arrayed in a larger panel which may be input to the substrate manufacturing process. The substrates 503 comprise the individual units that result from singulation of the strip 500 and the outer edge of the strip 500, or the strip waste areas 509, is a region of the strip that does not include any substrates to be singulated. Alternately, there may be no strip waste areas 509 and the substrate array may repeat.

The detail illustration in view "B" shows the location and scale of the repeating debuss-trace pattern layouts, or debuss repeating units 507. The detail may be rotated 90-degrees for vertical singulation lines and may also be executed at singulation lines bordering individual units and strip waste areas 509. Each parallel singulation area 505 may have an identical debuss pattern design, regardless of whether the singulation area borders substrates 503 only, or borders strip waste areas 509.

Figure 6:
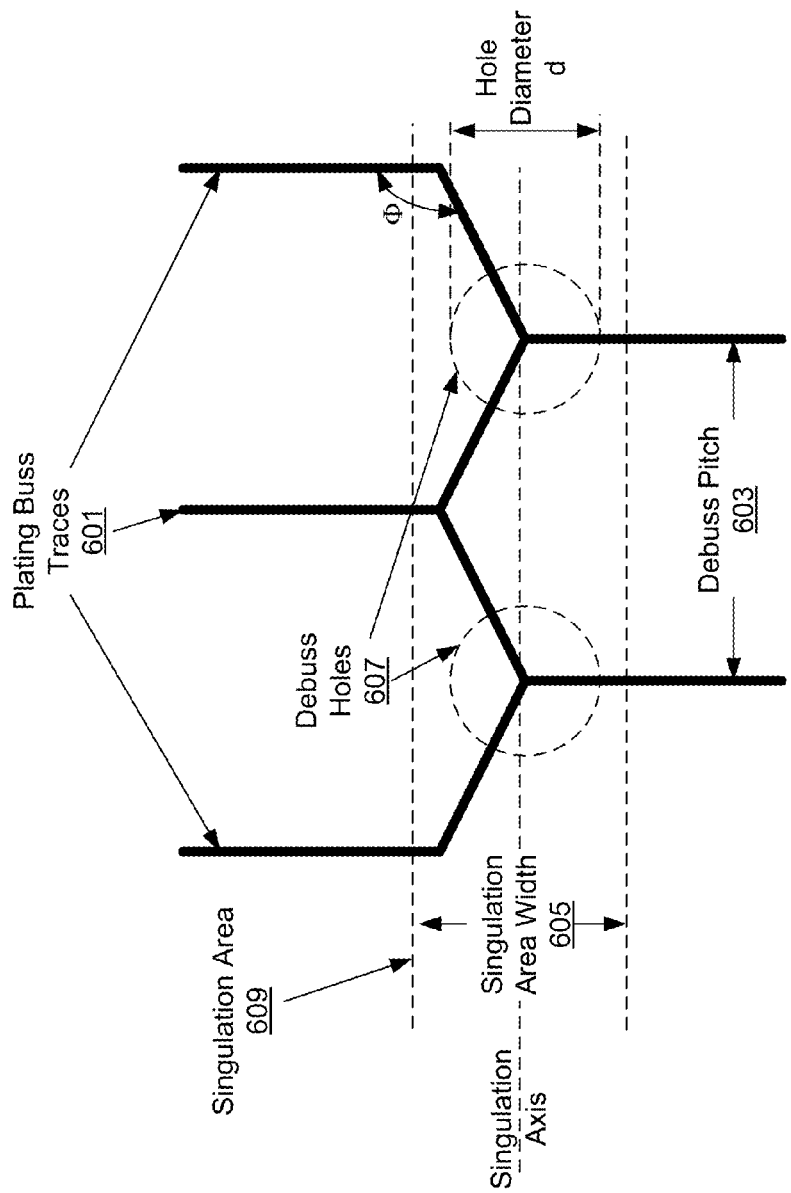
FIG. 6 is a drawing illustrating plating buss intersections, in accordance with an example embodiment of the invention.

FIG. 6 is a drawing illustrating plating buss intersections, in accordance with an example embodiment of the invention. Referring to FIG. 6, there are shown plating buss traces 601, debuss holes 607, and a singulation area 609. The plating buss traces 601 may be substantially similar to the plating buss traces 501 described in FIG. 5. The debuss 607 may comprise holes that are formed to decouple the plating buss traces 601. The variables in the plating buss intersection through-hole process may comprise the debuss pitch 603, the angle (I), the singulation area width 605, and the hole diameter d.

In an example scenario, the plating buss traces 601 may have a nominal width of 40 μm, but are not necessarily so limited. In general, buss traces may be preferred with narrower widths improving the density of plating buss trace 601 and active trace circuitry, while staying within manufacturing technology limits, to improve yields. The plating buss traces 601 may be created by any method, and be of any conductive material known to those skilled in the art. The interconnected plating buss traces 601 may eliminate the need for a linear plating bar, such as the plating bar 205, since the repeating pattern within the singulation area 609 serves the same purpose of interconnecting the traces.

In an example scenario, the hole diameter d may be approximately 150 μm, the width of the singulation area 609, the singulation area width 605, may be ~300 μm, and the debuss pitch 603 may be on the order of 500 μm. However the invention is not necessarily so limited, as the dimensions may be changed based on manufacturing processes or material characteristics, for example. The debuss pitch may vary between different areas of the substrate, due to aspects of the functional circuitry, for example. The debuss holes 607, may be formed using a mechanical means, such as with a drill bit, or via a laser, for example. The pattern of the plating buss traces 601 may be asymmetrical about the singulation axis, but may be identical from unit to unit. The pattern of the plating buss traces 601 may include fewer or more traces connecting at the center of the hole (i.e., not limited to a three debuss trace intersection, so that 2 traces or 4 traces may intersect, for example.

In this example, the three traces are radially arrayed at 120-degrees, resulting in upper and lower plating buss traces 601 respectively 30-degrees and 90-deg off-axis of the singulation axis. High parallelism of the plating buss traces 601 and the singulation axes may decrease yield at saw singulation, as slivers of metal may be delaminated from the substrate rather than be cleanly sawn and be redeposited onto the substrate causing electrical shorts, for example, so the plating buss traces 601 may alternately be oriented at larger angles in the singulation area 609 to enhance saw yield.

Figure 7:
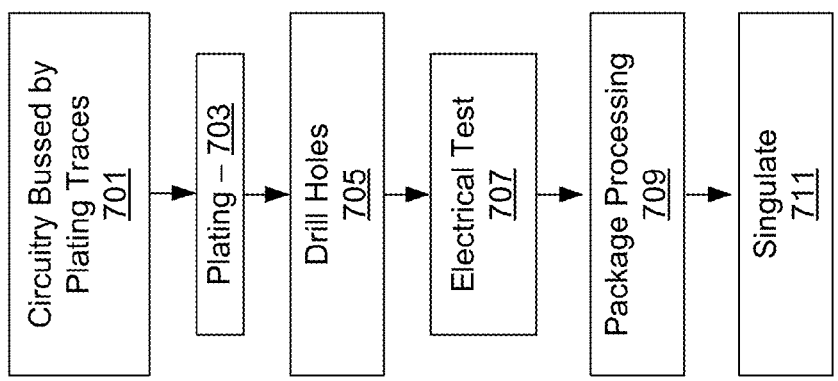
FIG. 7 is a flow diagram illustrating example steps in a process utilizing bussed plating, debussing and electrical testing prior to substrate singulation, in accordance with an example embodiment of the invention.

FIG. 7 is a flow diagram illustrating example steps in a process utilizing bussed plating, debussing and electrical testing prior to substrate singulation, in accordance with an example embodiment of the invention. Referring to FIG. 7, there is shown a plating process beginning with step 701 where plating traces in a packaging substrate may be coupled via a plating bar on a strip of substrates, or panel, to be singulated. Bussed traces may enable the plating of traces and regions of the substrate utilizing internal and/or external plating traces.

In step 703, the packaging substrate may be plated in an electrochemical plating process, for example, where a bias applied to the coupled plating buss traces enables the plating process. The plating process may apply metal to areas of the packaging substrate with the applied bias, thereby enabling the plating of many exposed features in a single process.

In step 705, decoupling holes may be formed at the intersections of the plating buss traces and the plating bar, thereby electrically isolating traces and regions. The traces may be in a "Y" pattern at the intersections to mitigate shorts from debris generated in the drilling process or the subsequent singulation.

In step 707, electrical tests may be performed to check for shorts or open circuits in the substrate. Since the various traces and plated regions are separate prior to singulation, the electrical tests are enabled before singulation, which may reduce manufacturing costs and improve yields.

The substrates may then be utilized in a packaging process 709 with electronic devices and/or semiconductor die bonded to the substrates and encased in a package.

In step 711, the packaging substrate, panel, or any smaller segment of a panel or strip may be cut in the saw streets or singulation areas thereby singulating the strip into a plurality of substrates. The sawing process may be achieved with a mechanical saw, laser, or other suitable cutting process.

In an embodiment of the invention, methods are disclosed for temporary bussing of packaging substrates and may comprise metal plating regions of a packaging substrate 200, 300, and 400. The metal plated electrically coupled traces 203, 207 may be decoupled by forming debuss_holes 607 at one or more intersections of the electrically coupled traces 203, 207, 601. The decoupled traces 403 may then be electrically tested, and the panel 500 may be singulated into a plurality of substrates 503 utilizing a sawing process through singulation areas 209, 609 in the packaging substrate 200, 300, and 400.

The traces 203, 207 may be electrically coupled via one or more plating bars 205 in the packaging substrate 200, 300, and 400. The plating bars 205 may be located in the singulation areas 209, 609. The intersections of the traces 203, 207, 601 may be in a Y pattern as an alternative to a straight T pattern, which may be repeated along the singulation areas 206, 609. The through-holes 607 may be drilled utilizing mechanical drilling. The debuss holes 607 may be formed utilizing lasing. Exposed regions of the packaging substrate may be metal plated utilizing an electroplating process. The plurality of electrically coupled traces may be biased for the electroplating process. The debuss holes 607 may be located in the singulation areas 209, 609.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for semiconductor packaging, the method comprising:
    metal plating regions of a packaging substrate utilizing a plurality of bussed traces of said packaging substrate; and
    decoupling the bussed traces after said metal plating by mechanically drilling individual debuss holes through intersections of said bussed traces and said packaging substrate
    prior to any elongate cutting extending along saw streets of the packaging substrate.

2. The method according to claim 1, wherein said bussed traces are electrically coupled via one or more plating bars in said packaging substrate.

3. The method according to claim 2, wherein said plating bars are located in singulation areas used in a sawing process for singulating the packaging substrate into a plurality of substrates.

4. The method according to claim 1, wherein said debuss holes are formed at intersections of said bussed traces that are in a Y pattern.

5. The method according to claim 4, wherein said Y pattern is repeated along singulation areas used in a sawing process for singulating the packaging substrate into a plurality of substrates.

6. The method according to claim 1, comprising electrically testing the decoupled traces for continuity.

7. The method according to claim 1, wherein said mechanically drilling said debuss holes comprises drilling with a drill bit.

8. The method according to claim 1, comprising metal plating said regions of said packaging substrate utilizing an electroplating process.

9. The method according to claim 8, comprising biasing said plurality of bussed traces for said electroplating process.

10. The method according to claim 1, wherein said debuss holes are located in singulation areas used in a sawing process for singulating the packaging substrate into a plurality of substrates.

11. A method for semiconductor packaging, the method comprising:
    metal plating regions of a pair of substrates on a substrate panel utilizing a plurality of bussed traces of said pair of substrates; and
    decoupling the bussed traces after said metal plating by mechanically drilling debuss holes through said bussed traces and said packaging substrate
    prior to any elongate cutting along a saw street between the pair of substrates, wherein the drilling results in multiple individual semicircular notches at adjacent edges of each of the pair of substrates.

12. The method according to claim 11, wherein said bussed traces are electrically coupled via one or more plating bars in said pair of substrates.

13. The method according to claim 12, wherein said plating bars are located in singulation areas.

14. The method according to claim 11, wherein said debuss holes are formed at intersections of said bussed traces that are in a Y pattern.

15. The method according to claim 14, wherein said Y pattern is repeated along singulation areas used in a sawing process for singulating the substrate panel into said pair of substrates.

16. The method according to claim 11, comprising electrically testing the decoupled traces for continuity.

17. The method according to claim 11, comprising metal plating said regions of said pair of substrates utilizing an electroplating process.

18. The method according to claim 17, comprising biasing said plurality of bussed traces for said electroplating process.

19. The method according to claim 11, wherein said debuss holes are located in singulation areas used in a sawing process for singulating the substrate panel into said pair of substrates.

20. A method for semiconductor packaging, the method comprising:
    providing a semiconductor device on a surface of a packaging substrate of a panel, the panel comprising:
    regions plated utilizing bussed traces; and
    debuss holes through intersections of said bussed traces, the debuss holes located at a first perimeter side of the packaging substrate;
    and
    singulating the packaging substrate from the panel to expose a sidewall along the first perimeter side, the sidewall having semicircular notches and thereby being discontinuous.

21. The method according to claim 1, wherein the debuss holes each comprise a circular perimeter at a surface of the packaging substrate.

22. The method according to claim 11, wherein the debuss holes each comprise a circular perimeter at a surface of the packaging substrate.

* * * * *